Figure 1A:
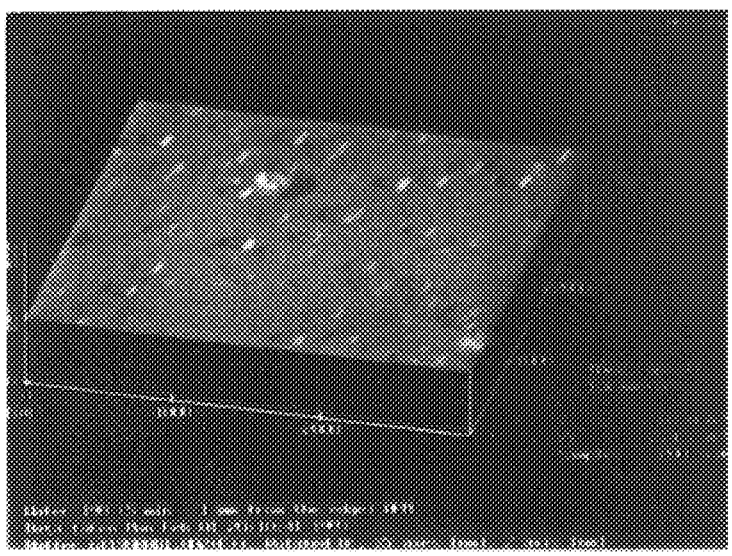
Figure 1B:
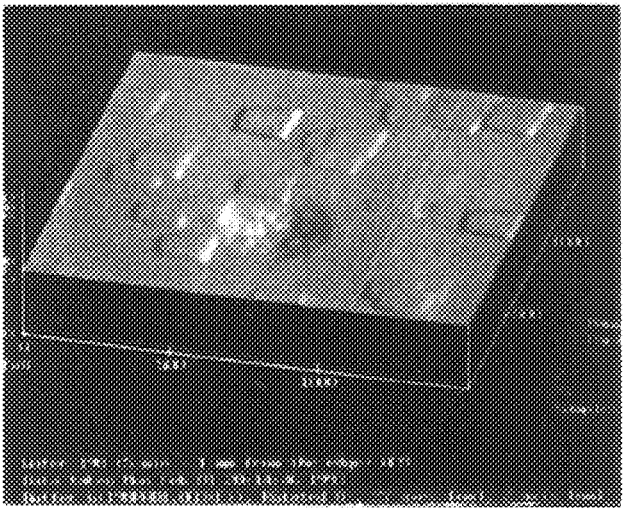
Figure 1C:
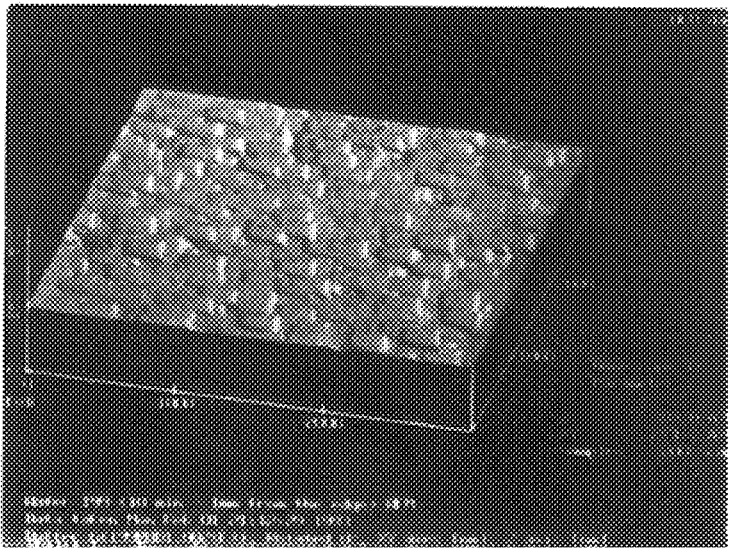
Figure 1D:
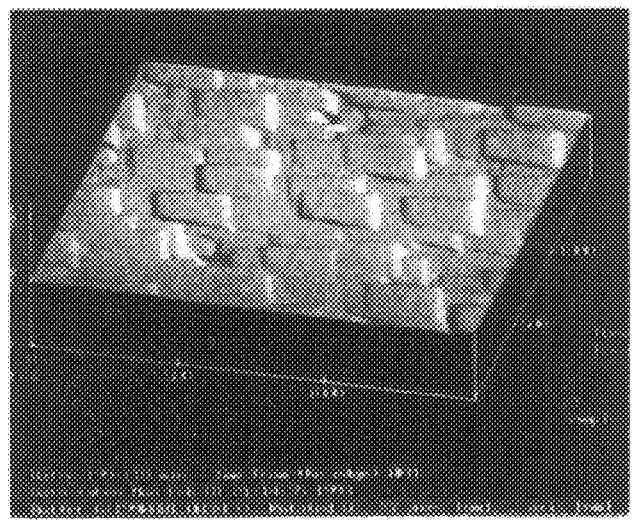
Figure 1E:
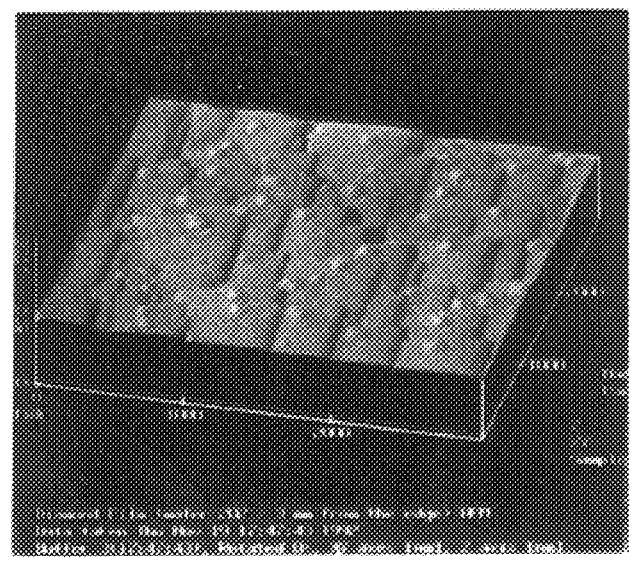
Figure 1F:
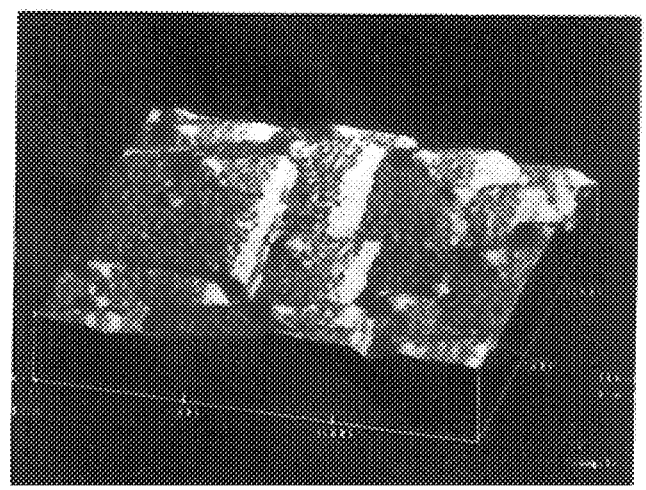

United States Patent

Buhaenko et al.

[11] Patent Number: 5,854,495
[45] Date of Patent: Dec. 29, 1998

[54] PREPARATION OF NUCLEATED SILICON SURFACES

[75] Inventors: David Buhaenko, Guildford; Peter John Ellis, Farnham; Paul Southworth, Bletchley; Carolyn Elizabeth Beer, Woking, all of Great Britain

[73] Assignee: Kobe Steel Europe Limited, London, Great Britain

[21] Appl. No.: 535,059

[22] PCT Filed: May 4, 1994

[86] PCT No.: PCT/GB94/00964

§ 371 Date: Mar. 26, 1996

§ 102(e) Date: Mar. 26, 1996

[87] PCT Pub. No.: WO94/27323

PCT Pub. Date: Nov. 24, 1994

[30] Foreign Application Priority Data

May 6, 1993 [GB] United Kingdom .................. 9309346

[51] Int. Cl.⁶ .................................................... H01L 29/80
[52] U.S. Cl. ........................... 257/77; 428/408; 428/688; 428/698; 117/929; 427/249; 427/589; 438/105
[58] Field of Search .............................. 257/77; 438/105, 438/DIG. 931; 428/408, 688, 698; 117/929; 427/249, 589; 148/DIG. 148

[56] References Cited

U.S. PATENT DOCUMENTS

| | | | |
|---|---|---|---|
| 5,145,712 | 9/1992 | Jesser et al. | 427/38 |
| 5,298,286 | 3/1994 | Yang et al. | 427/249 |
| 5,371,383 | 12/1994 | Miyata et al. | 257/77 |
| 5,397,428 | 3/1995 | Stoner et al. | 117/86 |
| 5,402,029 | 3/1995 | Nakamura et al. | 310/313 R |
| 5,424,561 | 6/1995 | Tachibana et al. | 257/77 |
| 5,442,199 | 8/1995 | Saito et al. | 257/77 |
| 5,471,947 | 12/1995 | Southworth et al. | 117/94 |
| 5,483,084 | 1/1996 | Hirabayashi | 257/77 |
| 5,487,945 | 1/1996 | Yang et al. | 428/408 |
| 5,491,348 | 2/1996 | Koyamao et al. | 257/66 |
| 5,493,131 | 2/1996 | Miyata et al. | 257/77 |
| 5,512,873 | 4/1996 | Saito et al. | 338/225 D |
| 5,523,160 | 6/1996 | Kobashi et al. | 428/408 |

OTHER PUBLICATIONS

Wolter, S. D., et al., "Textured growth of diamond on silicon . . . ", Appl. Phys. Lett. 62 (11), 15 Mar. 1993, pp. 1215–1217.

Primary Examiner—Sara Crane
Attorney, Agent, or Firm—Oblon, Spivak, McClelland, Maier & Neustadt, P.C.

[57] ABSTRACT

A structure is disclosed for growing semiconductor surfaces. A substrate such as a single crystal silicon substrate is treated by electrical biasing in the presence of a carbon-containing plasma to cause nucleation of the surface. By direct observation using atomic force microscopy (AFM), a nucleated surface consisting of a thin film of mutually parallel, quadrilateral carbon-containing platelets was seen to develop on the substrate. An optimum nucleated surface was determined to be substantially covered with such platelets whose slope relative to the substrate was less than 5°. Such a surface can serve as a template for growing semiconductor films, particularly of diamond, of well defined structure.

11 Claims, 8 Drawing Sheets

PREPARATION OF NUCLEATED SILICON SURFACES

This invention relates to the preparation of carbon containing films on substrates, especially single crystal substrates. Specifically, this invention relates to the formation of a thin film composed of aligned square platelets on a single crystal substrate. The invention includes a step-wise process for the production of a thin film structure of this type. The resulting films provide a template by which oriented films may be grown onto single crystal substrates.

The growth of thin film materials is an important concept used in the manufacture of electronic devices, e.g. integrated circuits and thermistors. The thin films used to form active regions of electronic devices are required to have a well defined structure and contain a low level of impurities.

Diamond films produced by microwave plasma chemical vapour deposition (CVD) can potentially be incorporated into electronic devices. However, CVD diamond suffers from the problem that it is a polycrystalline material and possess a random morphology. This results in boundaries forming between adjacent diamond grains. Non-diamond carbon deposits aggregate in these voids and interrupt the passage of electrical charge through the diamond film. Hence the material is of limited use for active electronic applications.

Our copending British patent application No. 2270326 describes a process for depositing oriented diamond films composed of aligned square crystals onto silicon substrates. This material has markedly improved characteristics as compared with random polycrystalline diamond films, including enhanced electrical properties, and consequently makes the production of active electronic devices feasible. Oriented films also show great potential in optical applications as windows and photolithography masks.

As a result of a greater insight into the structural changes occurring during the process described in our above patent application, it has been realised that a structure can be produced having a very thin carbon-containing film of aligned square platelets, which can be used as a template to form thicker layers of well defined structure.

According to one aspect of the invention there is provided a structure which comprises a substrate whose surface carries an adherent thin film of generally quadrilateral carbon-containing platelets, the structure of said film being visible by atomic force microscopy (AFM).

Semiconductor devices can be made by chemical vapour deposition (CVD) onto a suitable substrate. This technique can be used, for example, to grow a thin layer of diamond or silicon carbide onto a suitable substrate. The resultant semi-conducting layers have an oriented crystal structure with low angle grain boundaries between mutually adjacent grains. In the case of diamond, this structure reduces the aggregation of non-diamond carbon in the film and hence shows great promise in areas including active electronics, e.g. thermistors and transistors, and passive electronics, e.g. heat spreaders. For maximum effectiveness as a heat spreader, the diamond layer needs to be extremely flat in order to enhance the thermal conductance. Mechanical polishing of the diamond surface would lead to increased costs and can introduce undesirable pits into the diamond surface.

The present invention arises from the realisation that the surface characteristics of the final diamond or other semi-conducting surface are strongly influenced by preconditioning the surface prior to deposition of the semi-conducting surface by CVD. It is important to nucleate the substrate by a preconditioning step. The precise chemical changes occurring during such a step have been monitored by surface sensitive techniques, such as X-ray Photoelectron Spectroscopy (XPS). XPS analyses the energy distribution of photoelectrons emitted from a material exposed to bombardment by X-rays. Electrons are emitted from a material with energies that are characteristic of the elements which make up the material. These photoelectrons are also sensitive to the chemical state of the elements in the material. The examination of the nucleated surface by atomic force microscopy (AFM) and determination of its elemental and chemical composition by XPS provide a detailed analysis of the development of nucleation. The preferred nucleated surface is one in which a substantial portion (e.g. at least about 80%, preferably at least about 90%), is covered with generally quadrilateral platelets which are oriented in mutually parallel planes. Preferably, the platelets have a slope which differs by not more than about 50° and especially less than 2° to 30° from that of the substrate and from the slope of other platelets. Although AFM and XPS cannot be used directly in real time to monitor the nucleation step, they can be used indirectly to predict the precise conditioning treatment appropriate to secure a desired nucleated surface and thereby to predict the point when the preconditioning step is terminated and the CVD commenced.

In the case of a diamond film, the substrate is preferably a single crystal silicon substrate. A nucleated ultra-thin film of aligned, square platelets is formed on the substrate by a process in which the substrate surface is exposed to a carbon-containing plasma while being subjected to an electrical bias. Preferably, this step is immediately preceded by a further conditioning step in which the substrate is exposed to a carbon-containing plasma, preferably for at least one hour.

Upon completion of the above nucleation treatment, examination of the surface even using a scanning electron microscope (SEM) reveals little change. However, when examined by atomic force microscopy (AFM), the surface will be seen to be composed of an ultra-thin film having a pattern of square, aligned platelets. In the case of a silicon substrate, XPS shows that these platelets consist largely of silicon carbide with co-deposited non-carbide carbon. The resulting structure can be used as a template to grow thicker, aligned diamond films by microwave plasma CVD or other techniques, which are thick enough to be visible by scanning electron microscopy (SEM) and optical microscopy.

A structure having a thin, ordered nucleated silicon carbide layer is highly suitable for growing oriented diamond films. Similar principles can also be applied to the production of oriented films of other ordered cubic carbides, e.g. titanium, vanadium, molybdenum, tantalum or nickel. The invention may also be advantageously applied to the production of ordered SiC films.

SiC is a polymorphic crystalline material, which in the 3C or beta form is an excellent wide band semiconductor capable of optoelectronic behaviour. Thin films of single crystal β SiC are typically grown by chemical vapour deposition at high temperatures and pressures, in the range 1400–1600 K and pressures up to 1 atmosphere [R. F. David, J. W. Palmour, J. A. Edmond, Diamond & Related Materials 1, 109 (1992).] Reactive gases such silane are often required as part of the growth process. The advantage of the technique detailed here is that relatively low temperatures are involved, and reactive gases such as silane are not necessary in the nucleation stage. However, a reactive silicon-containing gas, e.g. such as $SiH_4$ may be added to the plasma after the biasing stage in order to deposit a layer of ordered SiC thereon by CVD.

A thin film of oriented platelets may be formed on a single crystal surface by a two-step process. A silicon substrate is first pretreated by exposure to a carbon-containing microwave plasma and then subjected to an electrical bias whilst monitoring the surface condition to determine the point at which biasing should cease.

Biasing usually takes the form of a negative dc voltage applied to the substrate, although positive dc voltage and ac voltages may be equally viable. The voltage is normally up to 300 volts with respect to earth. Desirably, the current passing through the substrate is maintained constant at a current density of between 1 and 20 mA/cm$^2$.

The oriented thin films in accordance with the invention may be prepared using the apparatus and general procedures described in our copending UK patent application No. 2270326, the disclosure of which is incorporated herein.

The formation of an oriented thin semi-conducting layer in accordance with this invention is generally a two stage process. In the first stage, the substrate is conditioned by exposing the surface to a carbon-containing plasma for a period of several hours, preferably at least one hour, to produce a nucleated polycrystalline carbide ultra thin film before commencement of biasing. During the conditioning stage, the source gas should contain at least carbon (C) and hydrogen (H) with the C/H ratio preferably between 0.1% and 10%, the gas pressure is 1 to 100 Torr, the substrate temperature is between 500° C. and 1000° C.

Most preferred conditions for a one inch diameter silicon substrate are: the source gas is 2% by volume of methane (CH$_4$) diluted by hydrogen, the gas pressure is 15 Torr, the substrate temperature is 800° C., the microwave power is 800 W and the total gas flow is 400 sccm.

It is found that longer pretreatment times (i.e. 3 hours and above) result in a better oriented diamond film when the same bias and growth conditions are used (see British Patent Application No. 2270326). This suggests that the surface structure formed after the biasing step is more ordered.

After the conclusion of the conditioning step, a biasing current is applied to the silicon substrate while continuing to operate the microwave plasma. The duration of biasing treatment is monitored by optical pyrometry (or laser interferometry) in the manner described in our above UK patent application. At the point at which biasing is adjudged to be complete, the biasing current is terminated.

The inventors have found that, in general, the following range of biasing conditions and biasing times may be employed to achieve growth of oriented films; the source gas should contain at least carbon (C) and hydrogen (H) with the C/H ratio between 0.1% and 10%, the gas pressure is 1 to 100 Torr, the substrate temperature is 500° C. to 800° C., the bias current is between 1 mA/cm$^2$ and 20 mA/cm$^2$, and the biasing time is between 1 and 60 minutes. Most preferred conditions for a one inch diameter silicon substrate are: the source gas is 5.18% by volume of methane (CH$_4$) diluted by hydrogen, the gas pressure is 23.1 Torr, the substrate temperature is 500° C., the microwave power is 800 W, the total gas flow is 500 sccm, the bias current is 6.6 mA/cm$^2$, and the biasing time is between 10 and 30 minutes, preferably between 10 and 15 minutes.

Upon completion of the biasing procedure, the resulting silicon wafers appeared to be substantially unchanged when viewed by optical and electron microscopy. However, AFM showed that the surface of the silicon wafer was composed of a thin film having a highly oriented structure of square, aligned platelets. XPS analysis showed the platelet layer consisted of substantially silicon carbide with co-deposited non-carbide carbon. AFM measurements were made at different positions on the wafer, because bias enhanced nucleation has been found to proceed from the wafer edge towards the centre. Hence, a non-uniform surface was expected. This is illustrated by reference to the following examples.

Example 1, Si(100)substrate

The development of an aligned, platelet layer on the low index (100) face of a silicon substrate is shown in FIGS. 1(a)–(f). These are AFM images of a silicon surface taken after 5, 10 and 30 minutes biasing of the silicon substrate under the preferred conditions described above.

After 5 minutes bias, the wafer edge consists of aligned square platelets, approximately 40 Å high and 2000 Å long. Note that the platelets are not closely packed, and a shallow depression is in the centre of this image. Just 3 mm from the wafer edge there are no platelets, but pits are found instead. It is speculated that the depression at the wafer edge was a pit that had become partially covered because of the surface changes caused by biasing. As mentioned previously, it was expected that any surface modification would appear at the wafer edge initially.

Continued biasing for ten minutes produces the surface features in Figures c and d. Now at the wafer edge the density of square platelets is much higher, and some overlapping occurs. Again the step height of the platelets is approximately 40 Å, but the length is now about 2700 Å. Square platelets are now found further towards the wafer centre, although the density of these features is lower than at the edge.

The third set of images (Figures e and f) correspond to a silicon surface subjected to 30 minutes biasing. Square platelets are found from the edge to the centre of the sample. Considerable overlap of the platelets is noted, as well as a pronounced tilting of 5° or more. The degree of tilt reduces from the edge to the centre and nucleation should be discontinued before significant tilting of more than 5° is observed. Another aspect of these AFM images is that the surface of the platelets is not smooth but covered with domed protuberances. The protuberances may be due to changes of growth habit (i.e. renucleation). After 30 minutes biasing, the platelets at the edge typically have step heights of 400 Å and lengths of 5000 Å. These observations suggest that the nucleation process had proceeded too far by 30 minutes biasing. AFM observations therefore indicate that in this Example biasing at a point between 10 and 30 minutes would provide the optimum nucleated surface. This conclusion was confirmed by the following XPS measurements.

Figure 2A:
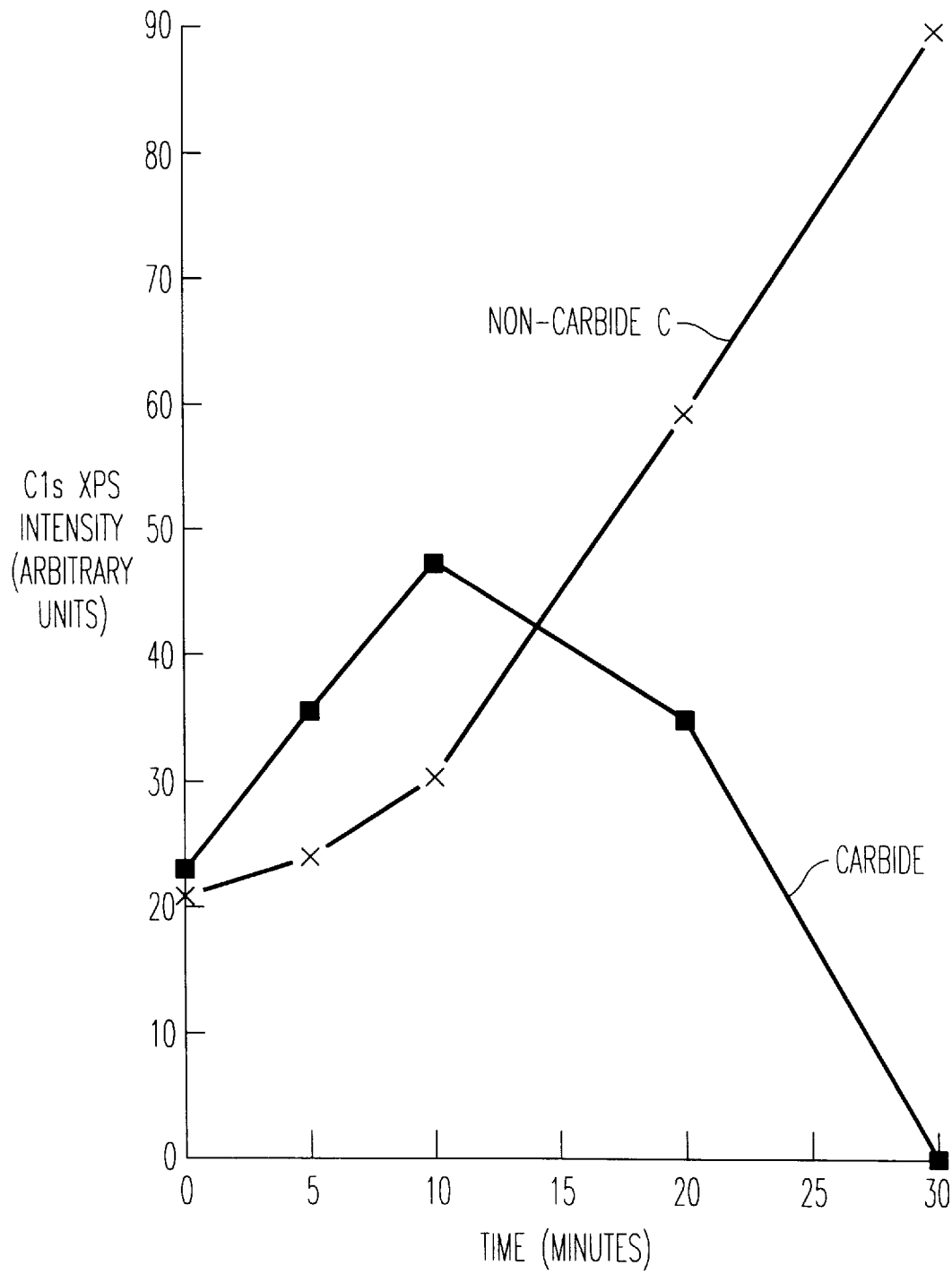
Figure 2B:
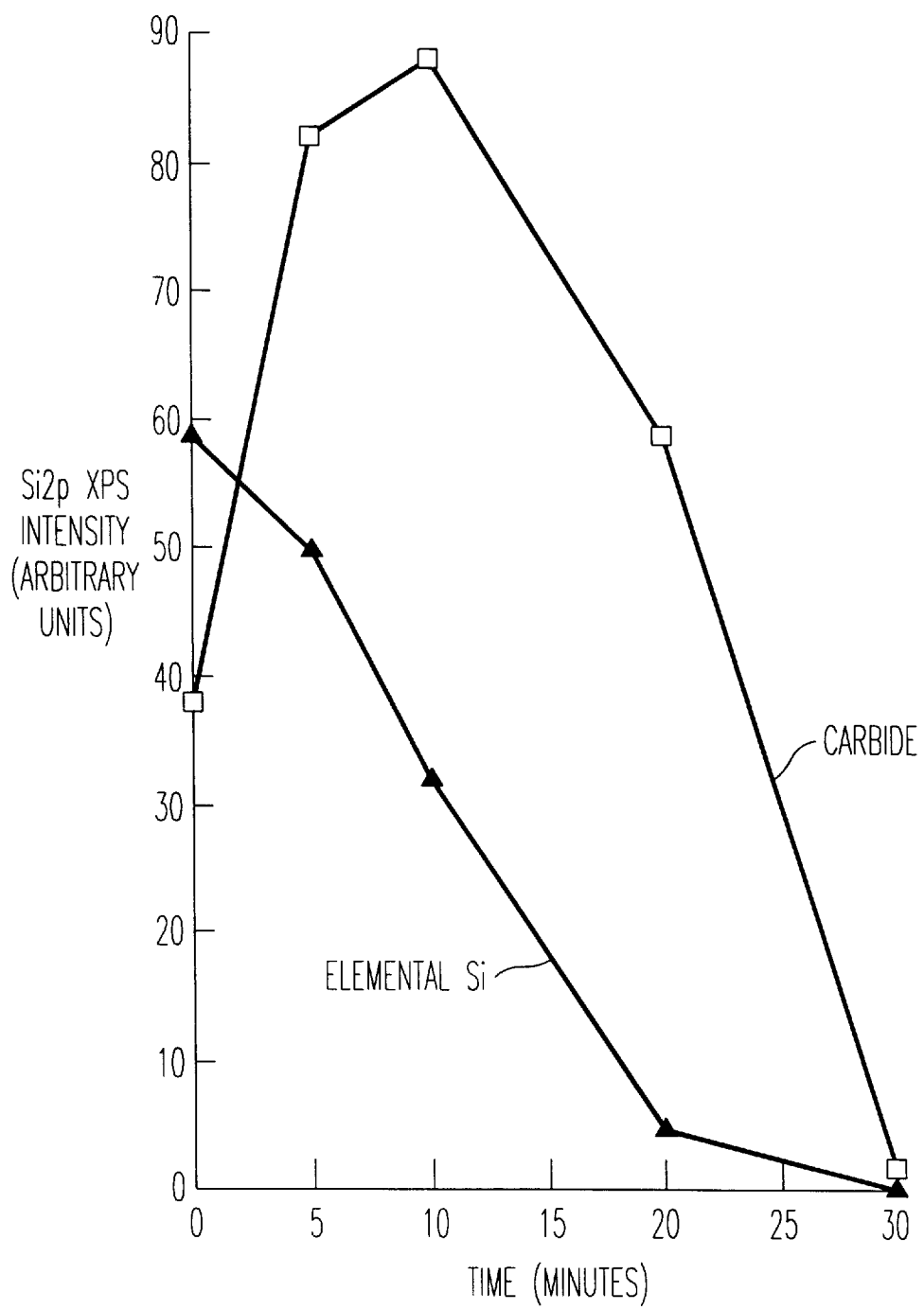

FIGS. 2(a) and (b) show the compositional changes in the developing bias platelet layer with increasing bias time to 30 minutes. This data can be compared directly to the AFM images. Precarburization prior to biasing results in a relatively thin, mixed carbon phase at the silicon surface. Silicon carbide is formed and this phase coexists with elemental silicon and other carbon phases, mainly sp$^3$ bonded carbon. Under biasing, the composition of the surface undergoes a series of changes which mirror the morphological changes seen by AFM. At 5 minutes bias, the carbide layer thickness increases and dominates the co-deposited sp$^3$ carbon signal. A substantial decrease in elemental silicon is seen. At this stage, platelet structures being to appear out of the silicon surface. As biasing proceeds, the platelet layer becomes better defined and there is an increase in carbide signal intensity. The silicon carbide signal reaches a maximum between 10 and 20 minutes bias. At 20 minutes bias, the carbide signal decreases and there is a corresponding increase in the competing sp$^3$ carbon signal; this signal is indicative of the diamond phase. At 30 minutes bias the carbide signal has disappeared and the carbon containing bias layer consists completely of $sp^3$ bonded carbon; other surface analytical techniques, such as micro-Raman spectroscopy, show this layer to be substantially diamond.

Example 2 Si(111)

FIGS. 3(a)–(f) show AFM images of a (111) silicon surface taken after 10, 20 and 30 minutes biasing under the same conditions as in Example 1.

Figure 3A:
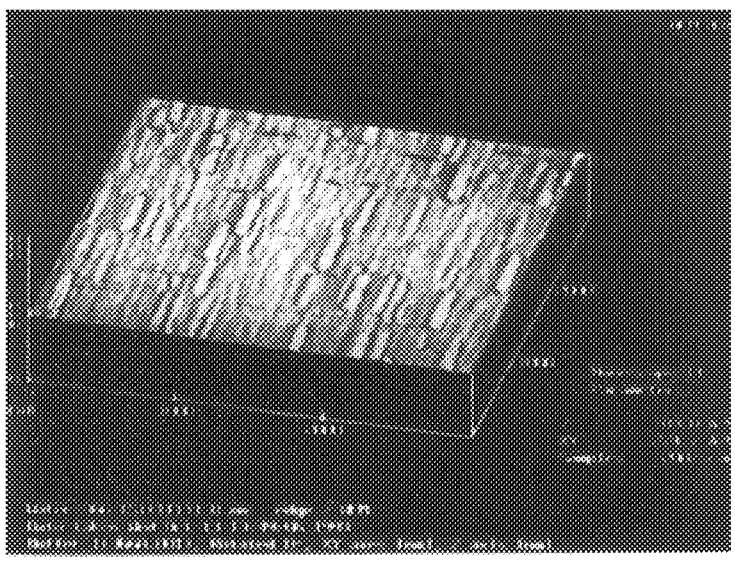
Figure 3B:
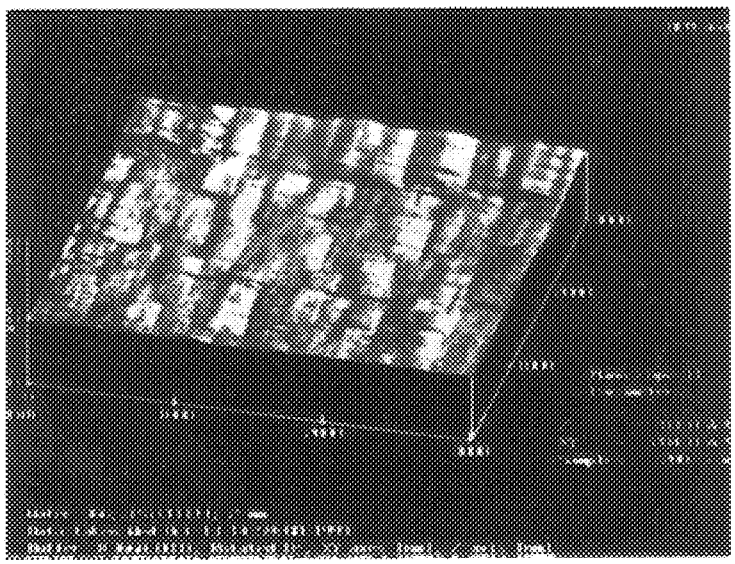

After 10 minutes bias, the wafer edge consists of a series of aligned, stick-like platelet features, approximately 5000 Å by 800 Å by 100 Å tall (FIG. 3a). At 3 mm from the wafer edge there are no sticks but instead aligned, square platelets are found. This is shown in FIG. 3b. These structures correspond with those seen on Si (100) surfaces at longer bias times. It is speculated that the stick structures may have coalesced together to form the ordered, square platelet layer. No platelets are seen after 4 mm in from the wafer edge.

Figure 3C:
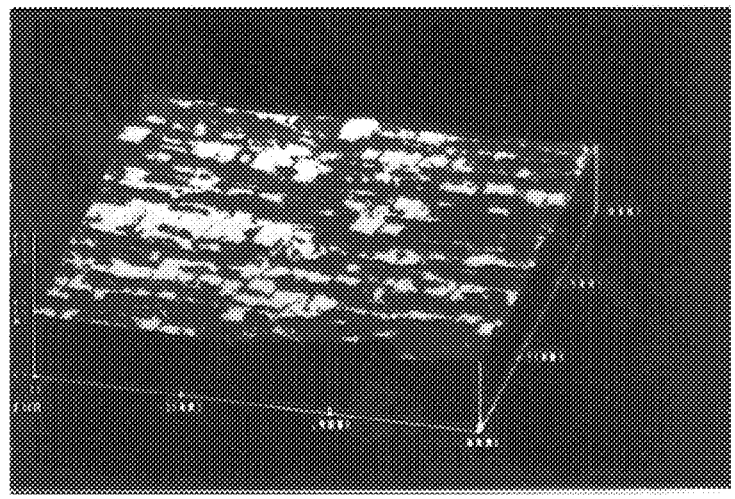
Figure 3D:
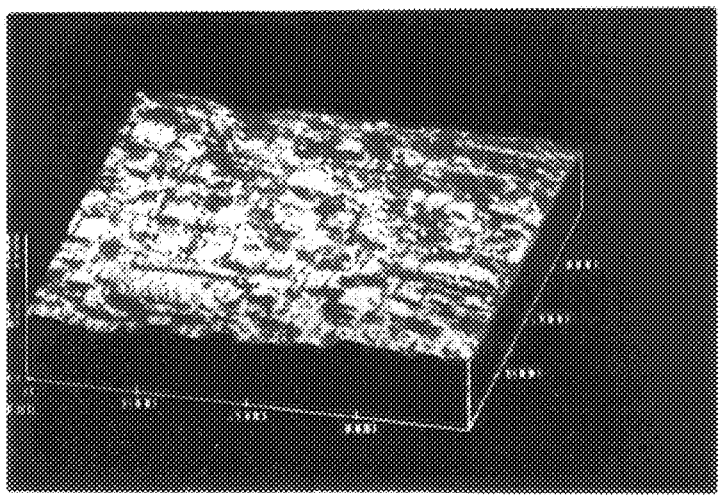

Continued biasing for 20 minutes results in a much rougher surface with an array of smaller, aligned, platelets which are poorly defined. These are shown in FIGS. 3c and d. Platelet size is approximately 3000 Å in length by 100 Å tall. It is difficult to ascertain from these images whether these platelets form a continuous layer.

Figure 3E:
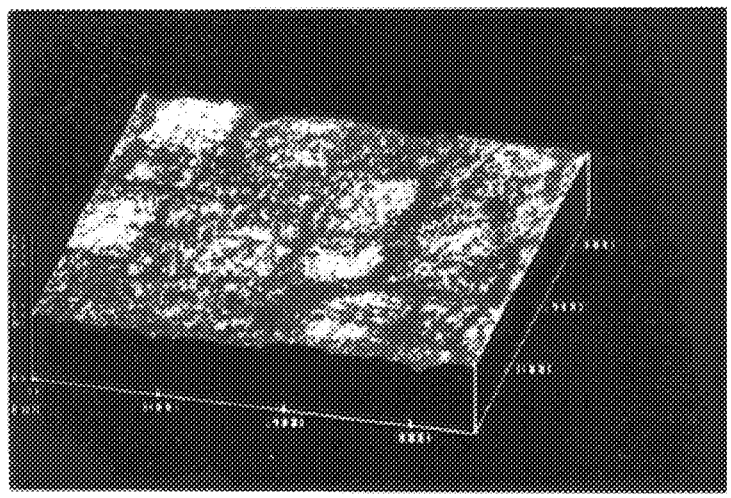
Figure 3F:
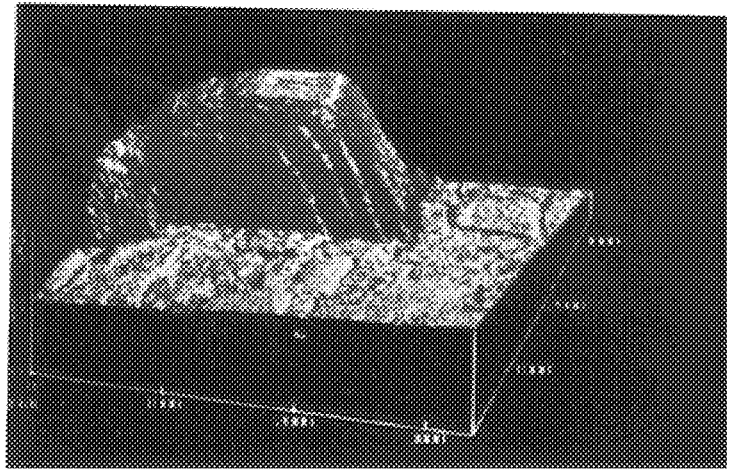

After 30 minutes biasing, a complete platelet layer forms across the surface from the edge of the wafer to the centre. The surface is covered in a continuous layer of aligned, square platelets, approximately 5000 Å by 5000 Å by 200 Å tall. The platelets are well formed at the wafer edge but become much rougher at 3 mm in from the edge. These are shown in FIGS. 3e and f. There are a number of very large, discrete features which sit on top of the platelets. These larger features are seen across the radius of the wafer and their general shape appear to reflect the underlying biased platelet layer. These blocks are approximately 10,000 Å by 10,000 Å by 5000 Å tall and adopt a regular quadrilateral shape as they grow upward.

Example 3 Si(110)

FIGS. 4a–f show AFM images of a silicon (110) surface taken after 10, 30 and 60 minutes biasing under the same conditions as in Example 1.

Figure 4A:
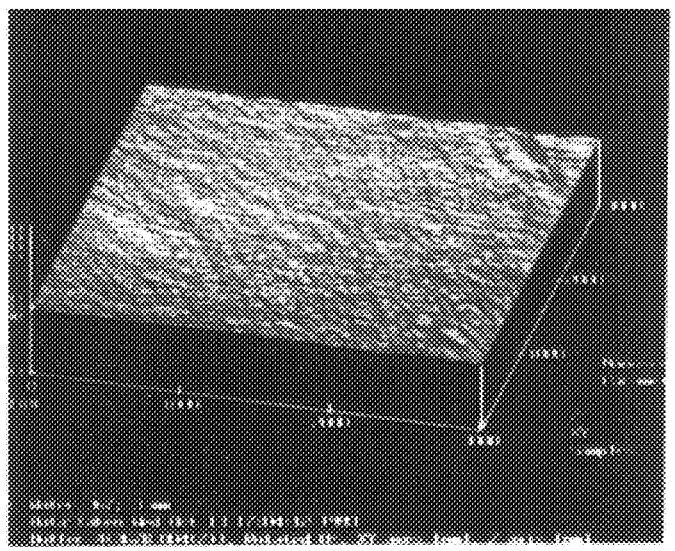
Figure 4B:
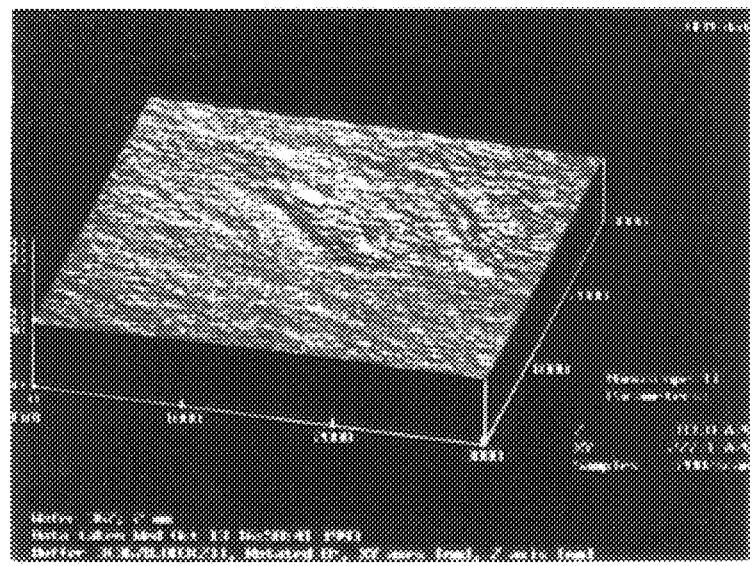

After 10 minutes bias no platelets are seen, instead the smooth silicon surface is roughened. This is shown in FIGS. 4a and b.

Figure 4C:
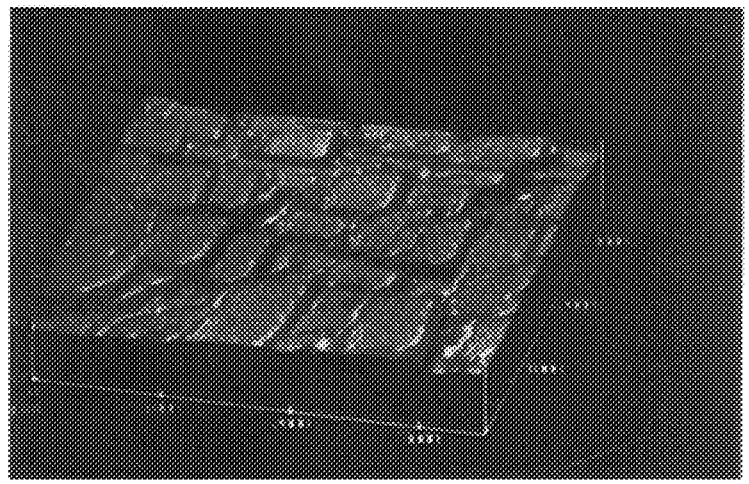
Figure 4D:
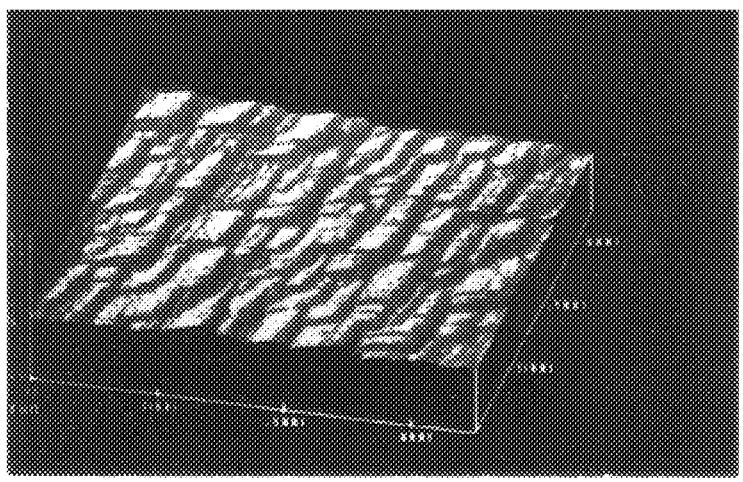
Figure 4E:
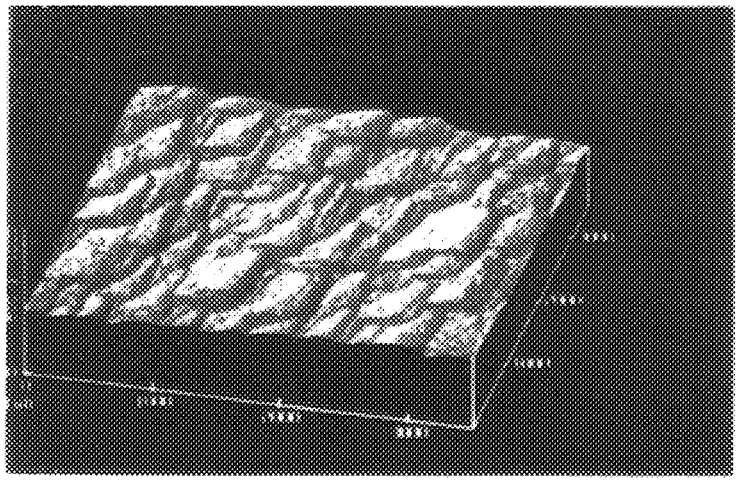
Figure 4F:
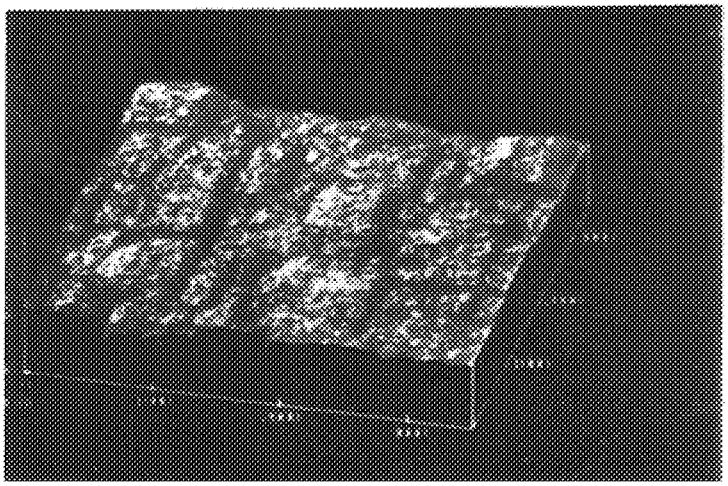

Platelet structures are seen after 30 minutes bias and form a continuous layer across the surface. FIGS. 4c and d show that the majority of platelets are approximately 2000 Å by 5000 Å by 100 Å tall, although they are at least 2–3 times larger at the wafer edge. At 3 mm from the wafer edge, there is a high density of overlapping platelets which are tilted greater than 50°.

After 60 minutes bias, the platelet structure is still visible at the surface. This is given in FIGS. 4e and f. The platelet structure is well defined at the wafer edge and shows a high degree of overlap; however, the tilt component is less pronounced at this bias time. Away from the wafer edge a well defined platelet layer is no longer seen and the surface becomes very rough. The platelet structures can still be seen, the platelets are much larger and there is less tilting. Platelet size is approximately 5000 Å by 5000 Å by 100 Å.

AFM data is consistent with a process that causes a progressive change in the surface of a silicon wafer from centre to edge as a function of time. By careful control of the biasing time the surface of a silicon wafer can be converted into a mosaic of interlocking platelets, of generally square shape, that stretch across the whole of the wafer and appear to be of similar size with a smooth top, an absence of protuberances or discrete, large blocks and tilting limited to not more than 50°. Bias for too short a period and pits in the silicon surface predominate, whilst too long a period produces a surface with a high density of overlapping platelets in which the top surface is uneven and tilting.

Because platelets formed by biasing have relatively low step heights, observations by optical or electron microscopy is not possible. Atomic force microscopy is a powerful tool for studying surfaces, but cannot detect the formation of platelets in real time. Instead it is envisaged that end pointing via optical pyrometry or laser interferometry will enable the bias process to be halted when the shape and distribution of platelets across the sample surface is optimum.

During the stage of growing the semi-conductor layer, e.g. by CVD, a dopant can be introduced to vary the properties of the final semi-conductor layer. For example, in the case of diamond, dopants such as B, Si, As and Sb may be employed.

Although the invention has been described with particular reference to the control of nucleation as a preliminary step in the growing of oriented diamond surfaces, the same technique can be employed in the growing of polycrystalline semi-conducting layers of other materials such as carbides or nitrides of B, Si, Ti, V, Ta, Mo or Ni on silicon or other substrates.

We claim:

1. A structure which comprises a single crystal substrate capable of forming a binary carbide, said substrate having a surface which has been nucleated for subsequent growth of an oriented diamond layer, the nucleated surface comprising a thin film of quadrilateral carbide containing platelets which are substantially coplanar, having a maximum slope of 5° at the top surface relative to the surface of the substrate, the platelets having a maximum dimension of 0.5 µm.

2. A structure as claimed in claim 1 wherein the platelets comprise a carbide of silicon or of a metal.

3. A structure as claimed in claim 2 wherein the metal is titanium, tantalum, vanadium, molybdenum or nickel.

4. A structure as claimed in claim 1 wherein the platelets have a slope which is not more than 50° and cover at least about 80% of the surface of the substrate.

5. A process for producing a substrate for use as a template for growing oriented carbon-containing films which comprises conditioning the surface of a single crystal substrate by exposing said surface to a carbon-containing plasma and subjecting the preconditioned surface to an electrical bias in the presence of a carbon-containing plasma under conditions such as to cause the formation of a nucleated surface of mutually, substantially coplanar quadrilateral carbide-containing platelets, said platelets having a maximum slope of 5° at the top surface relative to the surface of the substrate and having a maximum dimension of 0.5 µm.

6. A process as claimed in claim 5 wherein the substrate is a single crystal substrate capable of forming a binary carbide.

7. A process as claimed in claim 5 wherein the single crystal substrate is Si, Ti, V, Ta, Mo or Ni.

8. A process as claimed in claim 5 wherein the surface of the substrate is examined at intervals by atomic force microscopy (AFM) and/or X-ray Photoelectron Spectroscopy (XPS) to determine the particular conditions required to develop a surface substantially covered with a thin film of platelets whose major top surface has a slope of 50° or less with respect to the substrate and wherein there is a substantial absence of protuberances or discrete large blocks.

9. A process as claimed in claim 5 in which the initiation of the biasing step is determined by monitoring the point when the temperature of the surface markedly increases.

10. A process as claimed in claim 5 wherein the substrate is subjected to a negative dc bias while maintaining the biasing current substantially constant.

11. A process as claimed in claim 10 wherein said biasing current is monitored constant in the range of 1 to 20 mA/cm$^2$.

* * * * *

UNITED STATES PATENT AND TRADEMARK OFFICE
CERTIFICATE OF CORRECTION

PATENT NO. : 5,854,495
DATED     : December 29, 1998
INVENTOR(S) : David BUHAENKO et al.

It is certified that error appears in the above-indentified patent and that said Letters Patent is hereby corrected as shown below:

On the title page, item [22] PCT Filing date is incorrect. It should be:

--[22]  PCT Filed:  May 5, 1994--

Signed and Sealed this

Thirteenth Day of July, 1999

Attest:

Q. TODD DICKINSON

Attesting Officer

Acting Commissioner of Patents and Trademarks